US006208138B1

United States Patent
Lai et al.

(10) Patent No.: US 6,208,138 B1
(45) Date of Patent: Mar. 27, 2001

(54) BIAS FIELD ESTIMATION FOR INTENSITY INHOMOGENEITY CORRECTION IN MR IMAGES

(75) Inventors: Shang-Hong Lai, Plainsboro; Ming Fang, Cranbury, both of NJ (US)

(73) Assignee: Siemens Corporate Research, Inc., Princeton, NJ (US)

( * ) Notice: Subject to any disclaimer, the term of this patent is extended or adjusted under 35 U.S.C. 154(b) by 0 days.

(21) Appl. No.: 09/095,792

(22) Filed: Jun. 11, 1998

(51) Int. Cl.[7] ....................................................... G01V 3/00
(52) U.S. Cl. ................................................................ 324/307
(58) Field of Search ................................... 324/314, 320, 324/307, 309; 600/410, 416

(56) References Cited

U.S. PATENT DOCUMENTS 5,551,431 * 9/1996 Wells, III et al. .................... 324/307

OTHER PUBLICATIONS

Gonzales Rafael, Digital Image Processing, 1992, pp.: 47–51, 182–187, 213–219, 268–270.*

Gilles Sébastien, Bias Field Correction of Breast MR Images, Sep. 1996, 4th International Conference VBC'96, pp. 153–158.*

* cited by examiner

Primary Examiner—Christine Oda
Assistant Examiner—Dixomara Vargas
(74) Attorney, Agent, or Firm—Donald B. Paschburg

(57) ABSTRACT

An intensity inhomogeneity correction system includes a log operator which performs a log operation on the intensity values of the original MR image. A regular grid generator partitions the image domain and then a compute and select establishes reliable orientation constraints at grid locations. A bias field surface reconstructor reconstructs a bias field surface from selected orientation constraints with a thin-plate spline by using a preconditioned conjugate gradient. An intensity inhomogeneities remover subtracts an estimated bias function from the original log image and an exponential operation on the bias-field corrected log image provides a corrected image.

20 Claims, 7 Drawing Sheets

BIAS FIELD ESTIMATION FOR INTENSITY INHOMOGENEITY CORRECTION IN MR IMAGES

BACKGROUND OF THE INVENTION

1. Field of the Invention

The present invention relates to a general surface reconstruction system for bias field correction in MR images and more particularly to a shape-from-orientation system in a regularization framework to correct intensity inhomogenities in MR images.

2. Description of the Prior Art

Spatial intensity inhomogeneity induced by the radio frequency (RF) coil in magnetic resonance imaging (MRI) is a major problem in the computer analysis of MRI data. For example, the spatial intensity inhomogeneity has made the classification task in MRI very difficult for most of the existing segmentation methods. This is described by B. H. Brinkmann, A. Manduca and R. A. Robb, in "Quantitative Analysis Of Statistical Methods Of Grayscale Inhomogeneity Correction In Magnetic Resonance Images", Proc. SPIE Symposium On Medical Imaging: Image Processing, Vol. 2710, pp542–552, 1996, and by B. Johnston, M. S. Atkins, B. Mackiewich and M. Anderson, in "Segmentation Of Multiple Sclerosis Lesions In Intensity Corrected Multispectral MRI", IEEE Trans. Medical Imaging, Vol. 15, No. 2, pp. 154–169, 1996. This is due to the fact that the intensity inhomogeneities appearing in MR images produce spatial changes in tissue statistics, i.e. mean and variance. In addition, the degradation on the images obstructs the physician's diagnoses because the physician has to ignore the inhomogeneity artifact in the corrupted images. The spatial inhomogeneity is particularly severe in MR images acquired using surface coils. Therefore, the correction of spatial intensity inhomogeneity is regarded as an essential post-processing step to the computer analysis or processing of MRI.

The removal of the spatial intensity inhomogeneity from MR images is difficult since the inhomogeneities could change with different MRI acquisition parameters, from patients to patients and from slices to slices. Therefore, the correction of intensity inhomogeneities is usually required for each new image. A number of computer algorithms have been proposed for the intensity inhomogeneity correction in the last decade. B. R. Condon, J. Patterson, D. Wyper, A. Jenkins and D. M. Hadley, in "Image Non-uniformity In Magnetic Resonance Imaging: Its Magnitude And Methods For Correction", Brit. J. Radiol., Vol. 60, pp. 83–87, 1987, completed a thorough study of the magnitudes and types of grayscale nonuniformity. They also proposed two correction methods based on the signal produced by a uniform phantom. D. A. G. Wicks, G. J. Barker and P. S. Tofts, in "Correction Of Intensity Nonuniformity In MR Images Of Any Orientation", Magnetic Resonance Imaging, Vol. 11, pp. 183–196, 1993, followed the same approach and extended it to the correction for MR images of any orientation. Similarly, M. Tincher, C. R. Meyer, R. Gupta and D. M. Williams, in "Polynomial Modeling And Reduction Of RF Body Coil Spatial Inhomogeneity in MRI", IEEE Trans. Medical Imaging, Vol. 12, No. 2, pp. 361–365, 1993, modeled the inhomogeneity function by a second-order polynomial and fitted it to a uniform phantom scanned MR image. However, this phantom approach requires the same acquisition parameters for the phantom scan and the patient's. In addition, this approach assumes the intensity corruption effects are the same for different patients, which is not valid in general.

The homomorphic filtering approach described by B. Johnston, M. S. Atkins, B. Mackiewich and M. Anderson, in "Segmentation Of Multiple Sclerosis Lesions In Intensity Corrected Multispectral MRI", IEEE Trans. Medical Imaging, Vol. 15, No. 2, pp. 154–169, 1996, and by R. C. Gonzalez and R. E. Woods, in *Digital Image Processing*, Reading, M. A.: Addison-Wesley, 1993, has been commonly used due to its easy and efficient implementation. This approach is based on the assumption that the inhomogeneity function and the original uncorrupted signal are well separated in the frequency domain. Unfortunately, no justification of the above assumption has been made. Some researchers such as M. Tincher, C. R. Meyer, R. Gupta and D. M. Williams, in "Polynomial Modeling And Reduction Of RF Body Coil Spatial Inhomogeneity in MRI", IEEE Trans. Medical Imaging, Vol. 12, No. 2, pp. 361–365, 1993, and B. M. Dawant, A. P. Zijdenbos and R. A. Margolin, in "Correction Of Intensity Variations In MR Images For Computer-aided Tissue Classification", IEEE Trans. Medical Imaging, Vol. 12, No. 4, pp. 770–781, 1993, reported undesirable artifacts by using this approach.

B. M. Dawant, A. P. Zijdenbos and R. A. Margolin, in "Correction Of Intensity Variations In MR Images For Computer-aided Tissue Classification", IEEE Trans. Medical Imaging, Vol. 12, No. 4, pp. 770–781, 1993, proposed a surface fitting method to estimate the bias field. This method consists of selecting reference points in the same tissue class and fitting a thin-plate spline surface to these selected points. The reference points are selected either manually or through a tissue classification algorithm. The performance of this method substantially depends on the labeling of the reference points. Considerable user interactions are usually required to obtain good correction results. C. R. Meyer, P. H. Bland and J. Pipe in "Retrospective Correction Of Intensity Inhomogeneities In MRI", IEEE Trans. Medical Imaging, Vol. 14, No. 1, pp. 36–41, 1995, presented a polynomial fitting algorithm based on a prior segmentation of the corrupted MR image by using the Liou-Chiu-Jain segmentation algorithm. Note that the output of the segmentation is very critical to the correction result in this algorithm. As mentioned above, it is a very difficult task to obtain satisfactory segmentation results on the bias-field corrupted images. More recently, S. Gilles, M. Brady, J. Declerck, J. -P. Thirion and N. Ayache, in "Bias Field Correction Of Breast MR Images", Proceedings of the Fourth International Conference on Visualization in Biomedical Computing, pp. 153–158, Hamburg, Germany, Sep. 1996, proposed an automatic and iterative B-spline fitting algorithm for the intensity inhomogeneity correction of breast MR images. The application of this algorithm is restricted to the MR images with a single dominant tissue class, such as the breast MR images. Another polynomial surface fitting method described by C. Brechbuhler, G. Gerig and G. Szekely in "Compensation Of Spatial Inhomogeneity In MRI Based On A Parametric Bias Estimate", Proceedings of the Fourth International Conference on Visualization in Biomedical Computing, pp. 141–146, Hamburg, Germany, Sep. 1996, was proposed based on the assumption that the number of tissue classes, the true means and standard deviations of all the tissue classes in the image are given. Unfortunately, the required statistical information is usually not available.

As can be observed from previous works, the intensity inhomogeneity correction problem is strongly coupled with the segmentation problem. A primary goal for the inhomogeneity correction is to achieve better segmentation results, but many previous methods mentioned above require some classification information for the estimation of the bias field.

Recently, W. M. Wells, III, W. E. L. Grimson, R. Kikinis and F. A. Jolesz in "Adaptive Segmentation Of MRI Data", IEEE Trans. Medical Imaging, Vol. 15, No. 4, pp. 429–442, 1996, developed a new statistical approach based on the EM algorithm to iteratively solve the bias field correction problem and the tissue classification problem altogether in an alternative fashion. R. Guillemaud and M. Brady in "Estimating The Bias Field Of MR Images", IEEE Trans. Medical Imaging, Vol. 16, No. 3, pp. 238–251, 1997, further refined this approach by introducing an extra class "other". In addition, they also explore the possibility of using the minimum entropy to automatically choose the number of tissue classes and the associated parameters. This is due to the fact that the performance of this statistical estimation approach is very sensitive to the number of classes that was provided by the user. There are two main disadvantages of this EM approach. At first, the computation involved in the EM algorithm is extremely intensive, especially for large problems. Secondly, the EM algorithm requires a good initial guess for either the bias field or the classification estimate. Otherwise, the EM algorithm could be easily trapped in a local minimum, resulting in an unsatisfactory solution.

SUMMARY OF THE INVENTION

The present invention corrects intensity inhomogeneities in MR images and includes a bias field surface reconstructor that is formulated in a regularization framework. Unlike most previous systems, this system is fully automatic and very efficient. In addition, it can be applied to a wide variety of images since no prior classification knowledge is assumed. In this system, a finite element basis is used to represent the bias field function. Orientation constraints are computed at the nodes of the finite element discretization away from the boundary between different regions. The selection of reliable orientation constraints is facilitated by the goodness of fitting a first-order polynomial model to the neighborhood of each nodal location. The selected orientation constraints are integrated in a regularization framework, which leads to the minimization of a convex and quadratic energy function. This energy minimization is achieved by solving a linear system with a large, sparse, symmetric and positive semi-definite stiffness matrix. An adaptive preconditioned conjugate gradient system is employed to solve the linear system efficiently.

The present invention includes the following components; a log operator, a regular grid generator, a compute and select, a bias field surface reconstructor, an intensity inhomogeneities remover and an exponential operator. The log operator receives an original MR image and performs a logarithmic operation on all the intensity values of the original bias-field corrupted MR image. The regular grid generator generates a coarse regular grid on the image domain. The compute and select establishes the reliable orientation constraints from the original log image. Then the bias field surface reconstructor provides a bias field surface from selected orientation constraints with a thin-plate spline by using a preconditioned conjugate gradient algorithm. This spline surface reconstruction provides the solution of a large linear system, which is obtained by an efficient preconditioned conjugate gradient algorithm. Next, the intensity inhomogeneities are removed by subtracting the estimated bias field function from the original log image. Finally, the exponential operator provides the corrected MR image by taking the exponential operation of the bias-field corrected log image.

DETAILED DESCRIPTION OF THE INVENTION

Figure 1:
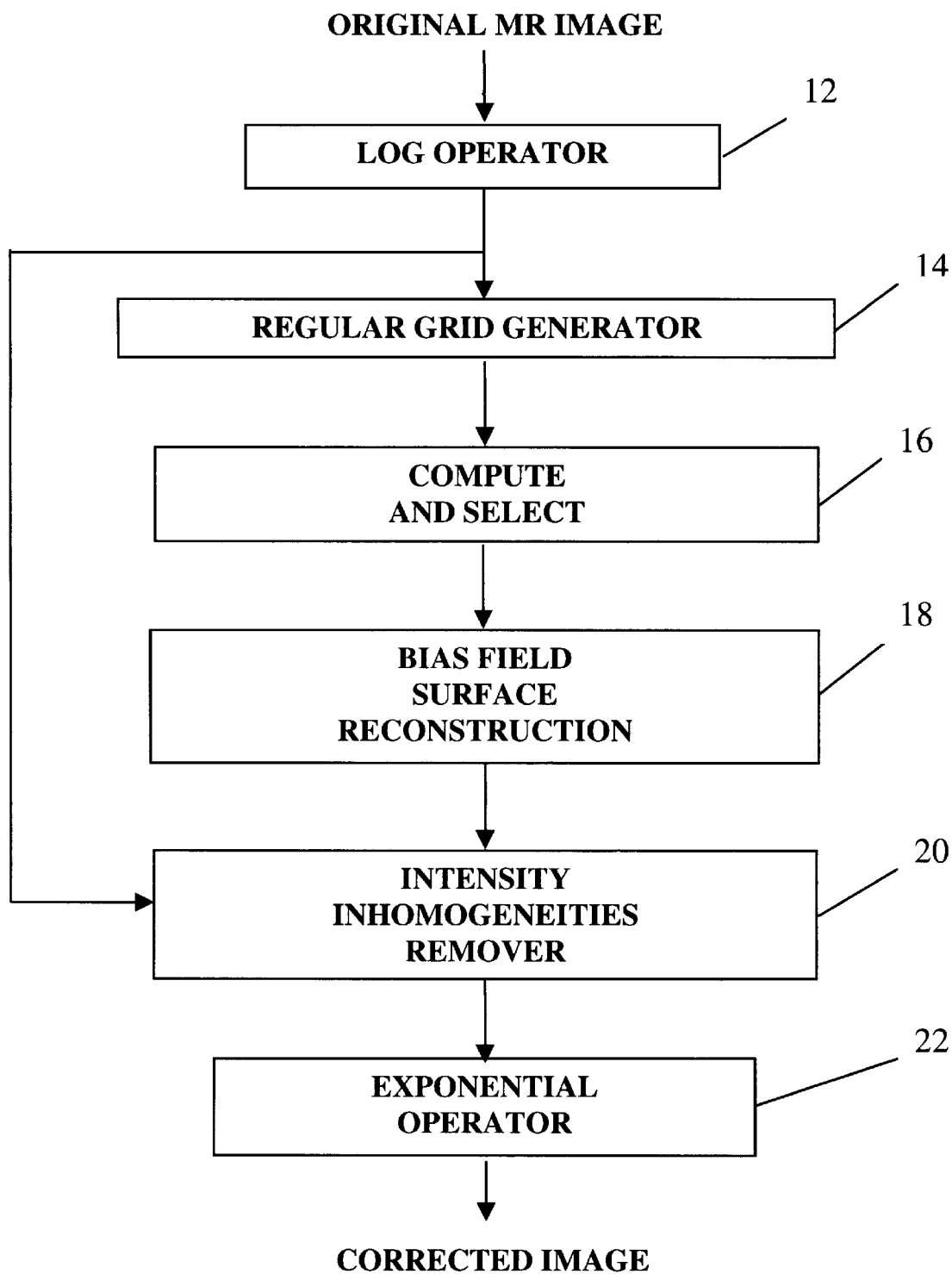
FIG. 1 illustrates a flow diagram of the present invention.

A flow diagram of the intensity inhomogeneity correction system of the present invention is shown in FIG. 1. The original MR image is inputted into the system. Log operator 12 performs a logarithmic operation on all the intensity values of the original bias-field corrupted MR image. Regular grid generator 14 generates a coarse regular grid on the image domain for the finite element discretization of the bias field surface function. This partitions the image domain by using the regular grid. Subsequently, in compute and select 16, the reliable orientation constraints are computed and selected from the original log image at the grid locations based on a confidence measure. Then, in bias field surface reconstructor 18, the bias field surface function is estimated by the thin-plate spline surface construction from the selected orientation constraints. This spline surface reconstruction provides the solution of a large linear system, which is obtained by an efficient preconditioned conjugate gradient algorithm. After the bias field function is reconstructed, the intensity inhomogeneities can be removed in intensity inhomogeneities remover 20 by subtracting the estimated bias field function from the original log image. Intensity inhomogeneities remover 20 also receives a signal from the output of log operator 12. Finally, exponential operator 22 provides the corrected MR image by taking the exponential operation of the bias-field corrected log image.

The present invention includes a new, efficient and general surface reconstruction system for bias field correction. The bias field correction problem is formulated as surface reconstruction from sparse orientation constraints in a regularization framework, with the sparse orientation constraints computed from the automatically selected locations in smooth regions of the image. A finite element solution is developed to reconstruct the bias field surface. After the finite element discretization, the surface reconstruction problem leads to solving a large and sparse linear system.

The present invention includes an adaptive preconditioned conjugate gradient system to solve this linear system efficiently. The system does not rely on any classification knowledge for the image. Therefore, it can be generally applied to different types of MR images.

The following will describe variational formulation. As discussed in the Description of the Prior Art, previous surface fitting methods for inhomogeneity correction require either that some reference points in the same tissue class are selected or that the image is segmented before the correction. Considerable user interaction is usually needed for the former. For the latter, satisfactory segmentation results are very difficult to obtain especially when the MR images are substantially corrupted by intensity inhomogeneities. The present invention includes a surface reconstruction system that uses sparse orientation constraints computed from the image at locations whose neighborhood pixels are in the same tissue classes. The orientation constraints for the bias field reconstruction are derived based on the assumption that the corrected intensity values in the same tissue class are almost the same and the bias field is spatially smooth. Although the tissue classification information is not available, it is much easier to determine if the pixels in a small neighborhood belong to the same tissue class. Then, the orientation constraints can be computed at the locations with their neighborhoods inside the same class regions. The bias field surface is reconstructed by integrating the sparse orientation constraints in a regularization framework.

The following introduces a new variational formulation for inhomogeneity correction by using a shape from orientation approach. Let the observed image (or the bias field corrupted image), the uncorrupted image and the bias field be denoted by $I(x,y)$, $\hat{I}(x,y)$ and $S(x,y)$, respectively. The relationship between these functions is given by $$I(x, y)=S(x, y)\hat{I}(x, y) \tag{1}$$

The above multiplicative relationship can be converted into an additive one by taking the logarithm transformation on both sides of the above equation, i.e.

$$I'(x, y)=S'(x, y)+\hat{I}'(x, y) \tag{2}$$

Where $I'(x, y)$, $\hat{I}'(x, y)$ and $S'(x, y)$ are the functions after taking the logarithm of $I(x,y)$, $\hat{I}(x,y)$ and $S(x,y)$, respectively. This logarithmic operation corresponds to log operator 12 of FIG. 1. Since the logarithm function is continuous, the assumption that the bias field $S(x,y)$ is smooth and the original image $\hat{I}(x,y)$ is roughly piecewise constant still holds for the transformed functions $S'(x,y)$ and $\hat{I}'(x,y)$. Thus the first-order partial derivatives can be taken on both sides of equation (2) at the location with its neighborhood inside a tissue class region and ignore the partial derivative of $\hat{I}'(x,y)$ due to the grayscale uniformity assumption in the same tissue class region. In other words, the orientation constraints for the logarithmic bias field function $S'(x,y)$ are given as follows:

$$\frac{\partial S'(x, y)}{\partial x} \cong \frac{\partial I'(x, y)}{\partial x} \tag{3}$$

$$\frac{\partial S'(x, y)}{\partial y} \cong \frac{\partial I'(x, y)}{\partial y} \tag{4}$$

at the locations (x,y) away from the borders of different tissue class regions. The problem to recover the 2D bias field function from sparse orientation constraints is ill-posed. However, the function $S'(x,y)$ can be reconstructed by integrating these orientation constraints in a regularization framework. This logarithmic bias-field function is then subtracted from the logarithmic image function to remove the intensity inhomogeneity. This corresponds to intensity inhomogeneities remover 20 of FIG. 1. Finally, the corrected image can be obtained by taking the exponential of the bias-field corrected logarithmic image function, i.e. $I'(x,y)-S'(x,y)$. This corresponds to exponential operator 22 of FIG. 1. The regularization formulation for the shape from orientation problem is to find the function $S'(x,y)$ that minimizes the following energy functional $$U(S') = \tag{5}$$
$$\int\int_\Omega \alpha(x, y)\left\{\left(\frac{\partial S'(x, y)}{\partial x} - p(x, y)\right)^2 + \left(\frac{\partial S'(x, y)}{\partial x} - q(x, y)\right)^2\right\} +$$
$$\lambda\left\{\left(\frac{\partial^2 S'(x, y)}{\partial x^2}\right)^2 + 2\left(\frac{\partial^2 S'(x, y)}{\partial x \partial y}\right)^2 + \left(\frac{\partial^2 S'(x, y)}{\partial y^2}\right)^2\right\}dxdy$$

Where $\Omega$ is the image domain, $\alpha(x,y)$ is a constraint selection function that assigns value 1 in the smooth regions and value 0 in the high gradient regions, $p(x,y)$ and $q(x,y)$ are the partial derivatives of $I'(x,y)$ with respect to x and y respectively, and $\lambda$ is the regularization parameter controlling the degree of smoothness. Note that the second integral corresponds to the thin-plate smoothness imposed on the function $S'(x,y)$. This is used to enforce the continuity in the first-order derivatives for a smooth function.

Figure 2:
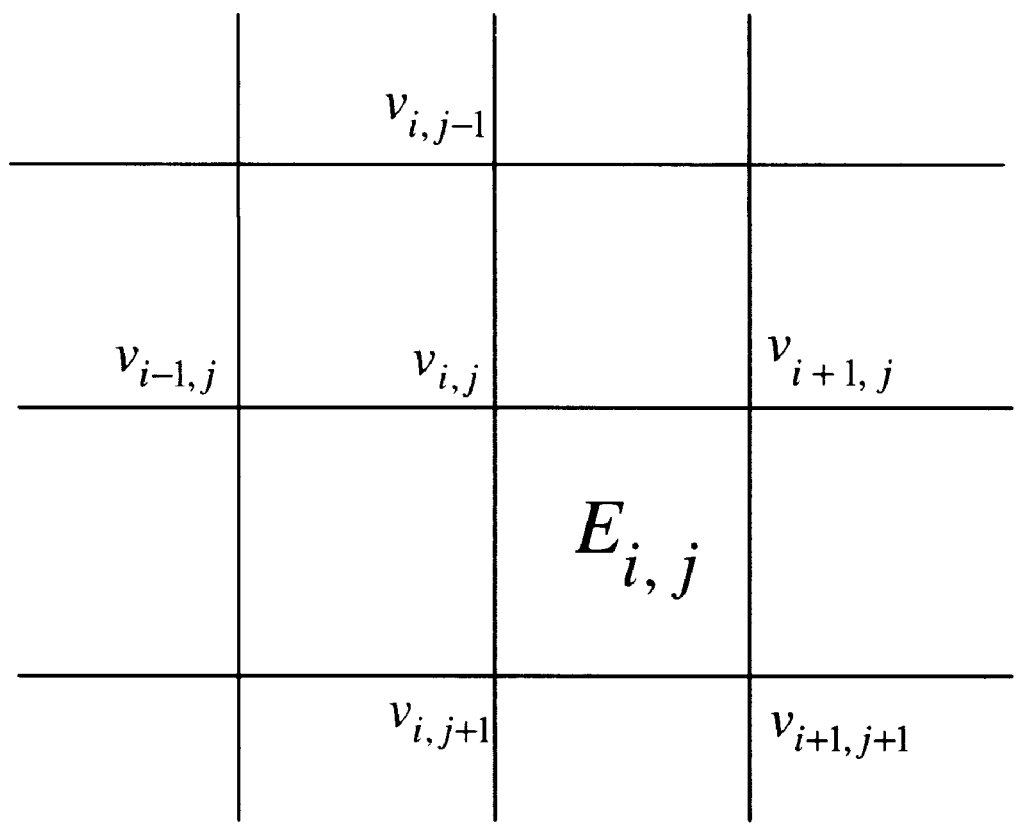
FIG. 2 illustrates a square non-conforming finite element $E_{i,j}$ where the element basis is a second-order polynomial with coefficients determined by its neighboring nodal variables.

The following will discretize the above variational principle via a finite element technique and show that the minimization problem leads to solving a linear system. A non-conforming finite element basis is used to represent the bias field function $S'(x,y)$ and discretize the energy functional given in equation (5). The non-conforming finite element representation for a 2D function is adopted from D. Terzopoulos, in "Multilevel Computational Processes For Visual Surface Reconstruction", Computer Vision, Graphics, Image Processing, Vol. 24, pp.52–96, 1983, and from D. Terzopoulos, in "The Computation Of Visible-surface Representation", IEEE Trans. Pattern Analysis Machine Intelligence, Vol. 10, No. 4, pp. 417–438, 1988. It consists of uniformly tessellating the original rectangular domain K into identical square elements $E_{i,j}$, for i=1, . . . ,m and j=1, . . . ,n. A nodal variable $v_{i,j}$ is assigned at each vertex of an element square as shown in FIG. 2. In each element $E_{i,j}$, a second-order polynomial function $p_{i,j}(x,y)$ is defined based on the neighboring nodal variables as follows $$p_{i,j}(x,y)=ax^2+bxy+cy^2+dx+ey+f, \tag{6}$$

where the coefficients are given by FIG. 2. FIG. 2 illustrates a square non-conforming finite element $E_{i,j}$ that the element basis is a second-order polynomial with coefficients determined by its neighboring nodal variables.

$$a = \frac{1}{2h^2}(v_{i+1,j} - 2v_{i,j} + v_{i-1,j})$$

$$b = \frac{1}{h^2}(v_{i+1,j+1} - v_{i,j+1} - v_{i+1,j} + v_{i,j})$$

$$c = \frac{1}{2h^2}(v_{i,j+1} - 2v_{i,j} + v_{i,j-1})$$

$$d = \frac{1}{2h}(v_{i+1,j} - v_{i-1,j})$$

-continued $$e = \frac{1}{2h}(v_{i,j+1} - v_{i,j-1})$$

$$f = v_{i,j}$$

To construct this finite element discretization for the bias field function, the image domain must be partitioned using a regular grid. This corresponds to regular grid generator 14 of FIG. 1. Note that the finite element function given in equation (6) is represented in a local x-y coordinate with the origin shifted to the nodal location of $v_{i,j}$. The logarithmic bias field function S'(x,y) can be approximated by a linear combination of the non-conforming finite element basis as follows $$S'(x, y) = \sum_{i=1}^{m} \sum_{j=1}^{n} v_{i,j} p_{i,j}(x - ih, y - jh) \quad (7)$$

Figure 3A:
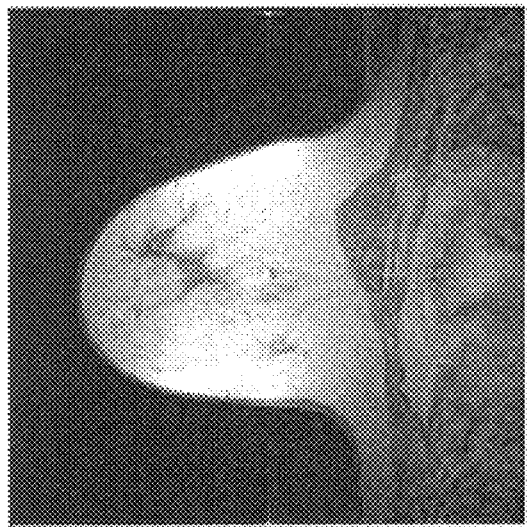
FIG. 3 illustrates a mamma image example with FIG. 3(a) illustrating a mamma image corrupted by intensity inhomogeneities, FIG. 3(b) illustrating selected locations with reliable orientation constraints overlaid with the original image and FIG. 3(c) illustrating the bias-field corrected image by using the present invention.
Figure 3B:
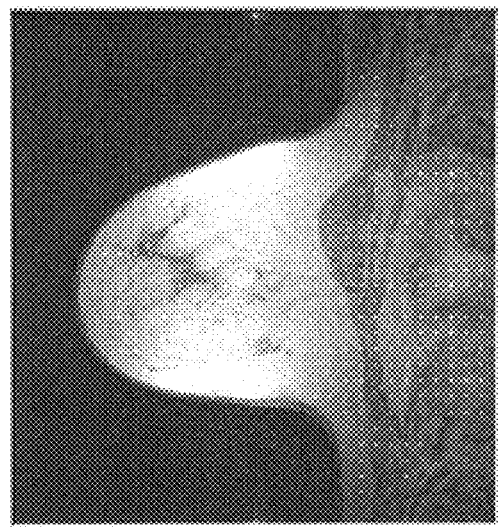
Figure 3C:

Substituting S'(x,y) in the energy functional U(S') by equation (7), provides the discretized energy function E given as follows in equation (8)

$$E(v) =$$

$$\sum_{i=1}^{m} \sum_{j=1}^{n} \alpha_{i,j} \left\{ \left( \frac{v_{i+1,j} - v_{i-1,j}}{2h} - I'_x(ih, ih) \right)^2 + \left( \frac{v_{i,j+1} - v_{i,j-1}}{2h} - I'_y(ih, ih) \right)^2 \right\} +$$

$$\frac{\lambda}{h^2} \{ (v_{i+1,j} - 2v_{i,j} + v_{i-1,j})^2 +$$

$$2(v_{i+1,j+1} - v_{i+1,j} - v_{i,j+1} + v_{i,j})^2 + (v_{i,j+1} - 2v_{i,j} + v_{i,j-1})^2 \}$$

where the vector v is a concatenation of all the nodal variables $v_{i,j}$, $I'_x$ and $I'_y$ are the first-order partial derivatives of I' along x and y directions, respectively. In this description, the orientation constraint selection function $\alpha_{i,j}$ is determined from the goodness of fitting the data I' in the neighborhood of the nodal location (i,j) by a first-order polynomial. The orientation constraint at a nodal point is selected when the fitting error in the neighborhood of this point is less than a threshold. This is because the function Î' is assumed to be a piecewise constant and the logarithmic bias field S'(x,y) is very smooth. The locations that are not well fitted by a first-order polynomial in their neighborhoods are very likely close to the borders between different tissue class regions. On the contrary, the neighborhoods of the locations corresponding to small fitting errors should be inside the same tissue class regions. FIG. 3 shows an example of the selected locations with reliable orientation constraints for a mamma MR image. The fitting error can be further utilized to indicate a confidence measure for the orientation constraints selected at the locations in Z. A confidence measure $\alpha_{i,j}$ can be assigned for the average fitting error $e_{i,j}$ at the node (i,j) as follows $$\alpha_{i,j} = \frac{c}{c + e_{i,j}} \quad (9)$$

where c is a positive constant. In this description, the constant c is empirically set to 1. This orientation constraint computation and selection process corresponds to compute and select 16 of FIG. 1.

The energy function E(v), given in equation (8), is a convex and quadratic function of the vector v. The minimization of this energy function can be achieved by solving a linear system Av=b, where $A \in \mathfrak{R}^{mn \times mn}$ is a large, sparse and symmetric positive semi-definite matrix and b is an mn×1 vector. The matrix A can be formed from the computational molecules given by D. Terzopoulos in "The Computation Of Visible-Surface Representation", IEEE Trans. Pattern Analysis Machine Intelligence, Vol. 10, No. 4, pp. 417–438, 1988. After solving the linear system for the vector v, the bias field function can be obtained from the finite element basis representation given in equation (7). FIG. 3 depicts an example of a bias-field corrupted MR image with the selected locations of reliable orientation constraints and the corrected image obtained by minimizing the above energy function.

The following will describe an adaptive preconditioned conjugate gradient algorithm to efficiently solve this linear system which corresponds to bias field surface reconstruction 18 of FIG. 1. The finite element discretization of the variational formulation leads to solving the linear system Av=b, where the matrix A is large, sparse and symmetric positive semi-definite. The matrix A is a singular matrix with rank-1 deficiency. Since the null space of the matrix A is the set of vectors with identical entries, the solution to this linear system can be obtained up to a constant elevation. This is due to the fact that the factorization of the bias-field corrupted image function I(x,y) into a smooth bias field function S(x,y) and a roughly piecewise constant function Î(x,y) is not unique. Another pair of solutions {aS(x,y),Î(x,y)/a} can always be found for a positive constant a(≠1). To resolve this ambiguity, the minimum norm solution is taken to the above linear system, i.e. the projection of the solution onto the null space of A is zero. This minimum solution corresponds to the assumption that the sum of all the bias-field corrected values I'(x,y) is the same as the sum of all the original values. This can be interpreted as an assumption for grayscale preservation.

Although the matrix A is sparse, it is not tightly banded. Its bandwidth is roughly O(m) or O(n). Iterative methods are better suited than direct methods for solving this type of linear systems, since direct methods require the formation of intermediate matrices which are not necessarily sparse. More precisely, the matrix factorization schemes involved in the direct methods produce intermediate matrices that are triangular and whose bandwidths are no larger than the bandwidth of the original matrix. However, fill-in does occur within the band after the matrix factorization for the 2D and higher dimensional problems. This can cause the number of operations and the amount of storage to be too expensive for 2D and higher dimensional problems. The present invention uses an adaptive preconditioned conjugate gradient system to solve the large and sparse linear systems.

For the symmetric positive semi-definite matrix A, the conjugate gradient algorithm can be used to solve the problem guaranteeing a unique solution. When a positive-definite preconditioner P is used to accelerate the convergence, what is known as the preconditioned conjugate gradient (PCG) algorithm exist as follows.

(1) Choose an initial $v_0$, and compute $r_0 = b - Av_0$; set k=0.
(2) Solve $Pz_k = r_k$; k=k+1.
(3) If k=1, $p_1 = z_0$; else compute $$\beta_k = \frac{a_{k-1}^N}{r_{k-2}^T z_{k-2}}$$

and update $p_k = z_{k-1} + \beta_k p_{k-1}$ (4) Compute $\alpha_k^N = r_{k-1}^T z_{k-1}$, $\alpha_k^D = p_k^T A p_k$ and $$\alpha_k = \frac{\alpha_k^N}{\alpha_k^D}.$$

(5) Update $r_k = r_{k-1} - \alpha_k A p_k$ and $v_k = v_{k-1} + \alpha_k p_k$.

(6) If $r_k \approx 0$, stop; else go to step 2.

In this description, an adaptive wavelet preconditioner is used to accelerate the convergence of the PCG algorithm. This adaptive preconditioner is constructed based on approximating the spectral characteristics of the matrix A. The matrix A consists of two components namely, one component matrix from the discretization of the orientation constraints and the other from the thin-plate smoothness. By integrating the spectral characteristics of these two component matrices, an approximate spectral function can be obtained for the matrix A. This spectral function is used to modulate the frequency characteristics of a chosen wavelet basis and these modulated values are then used in the construction of the preconditioner. The preconditioner is constructed in a wavelet basis and the motivation for using a wavelet basis as opposed to the Fourier basis is primarily computational. The computation for constructing the preconditioner can be achieved with O(N) operations in a wavelet basis unlike the O(N log N) computational complexity required for a Fourier basis, where N is the total number of discretization nodes. The details of the preconditioner construction are described by S. -H. Lai and B. C. Vemuri in "Physically Based Adaptive Preconditioning For Early Vision", IEEE Trans. Pattern Analysis and Machine Intelligence, Vol. 19, No. 6, pp. 594–607, 1997.

Figure 4A:
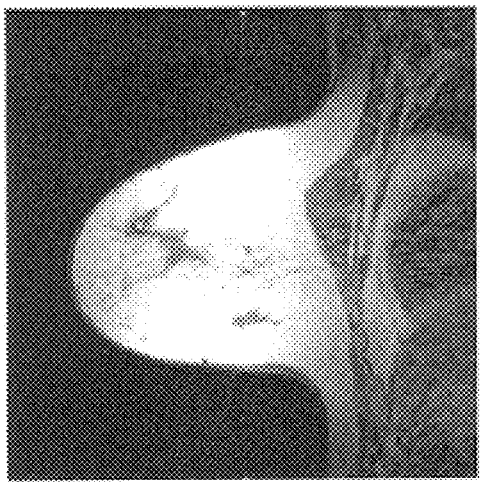
FIG. 4 illustrates a mamma image example with FIG. 4(a) illustrating the original MR image corrupted with intensity inhomogeneities, FIG. 4(b) illustrating the bias-field corrected image using the present invention, FIG. 4(c) illustrating the recovered bias field function in an image and FIG. 4(d) illustrating the bias field in a surface plot.
Figure 4B:
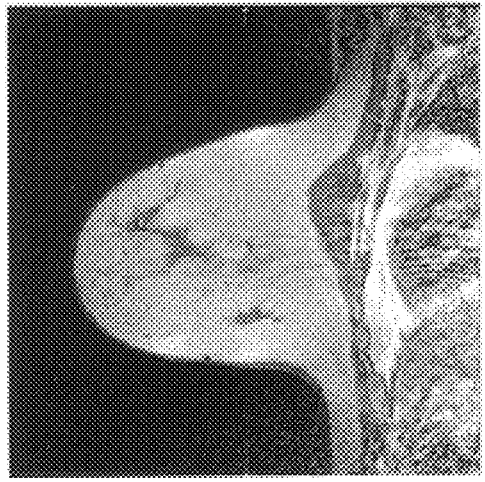
Figure 4C:
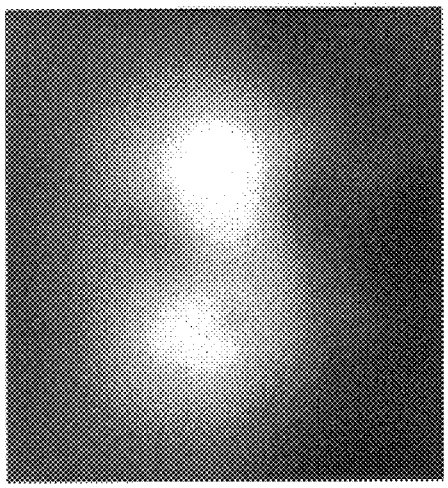
Figure 4D:
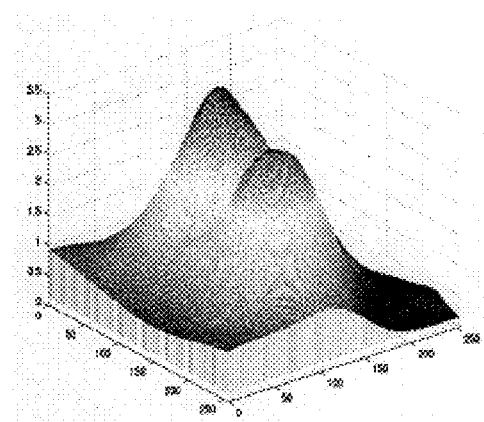
Figure 5A:
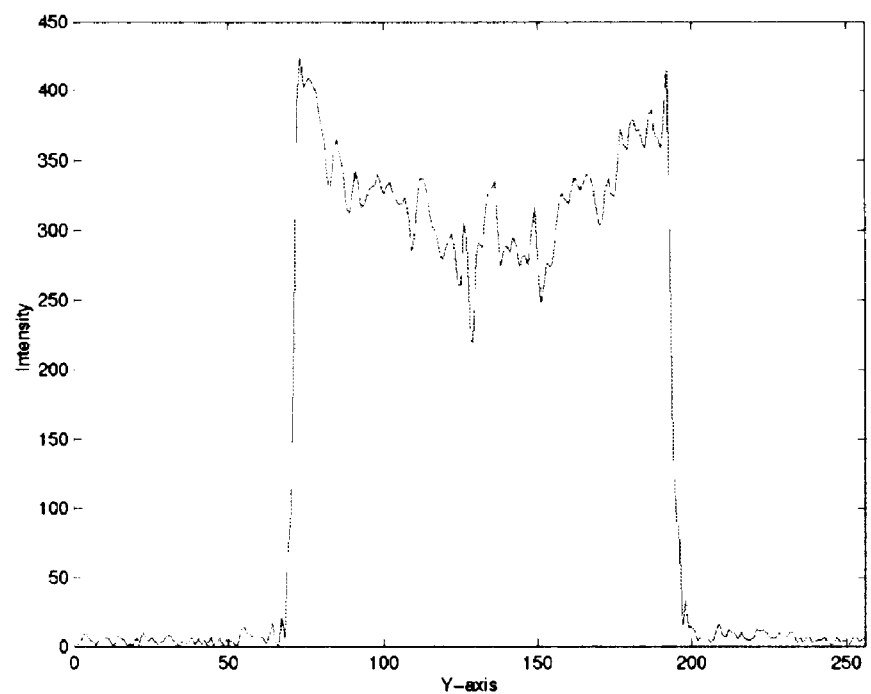
FIG. 5 illustrates cross sections at the 120-th column extracted from (FIG. 5(a)) the original bias-field corrupted mamma image and (FIG. 5(b)) the corrected image using the present invention. It is evident that the intensity distribution of the cross section after correction using the present invention is much more uniform than the original distribution.
Figure 5B:
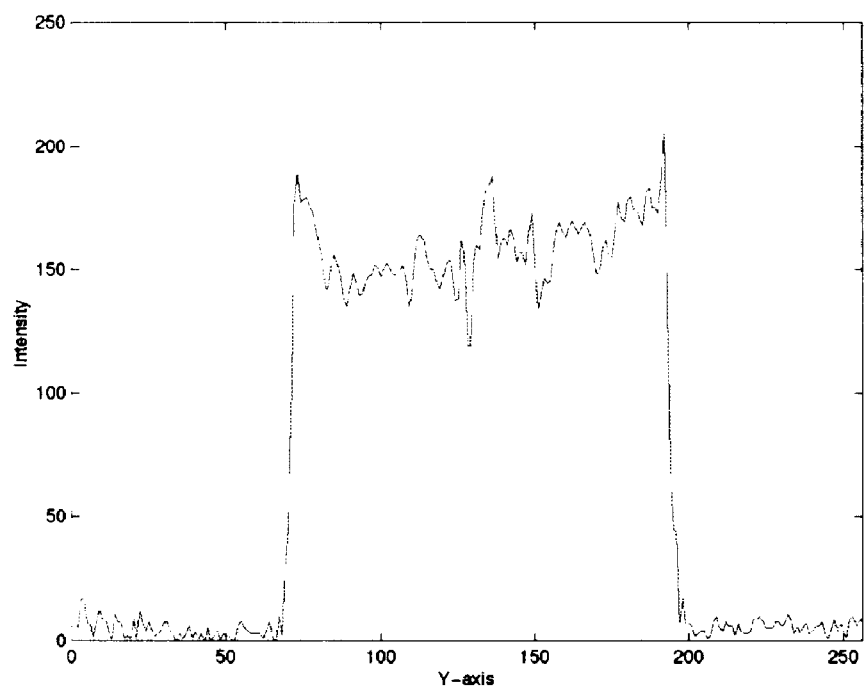

The following will describe some experimental results of applying the present invention to correct the inhomogeneities in MR images. In this example, a 32×32 grid is used in the finite element discretization. The system was applied to a variety of MR images corrupted with intensity inhomogeneities. FIG. 4 depicts an example on a mamma image. The original bias-field corrupted image and the corrected image are shown in FIG. 4(a) and FIG. 4(b). The recovered bias field is shown in an image display in FIG. 4(c) and in a surface plot in FIG. 4(d). By comparing both images, it is obvious that the intensity inhomogeneity is substantially corrected. The cross sections along the 120-th column for both the original image and the corrected image are depicted in FIGS. 5(a) and 5(b). It is evident from the cross section plots that the intensity distribution of the cross section after correction is much more uniform than the original distribution.

Figure 6A:
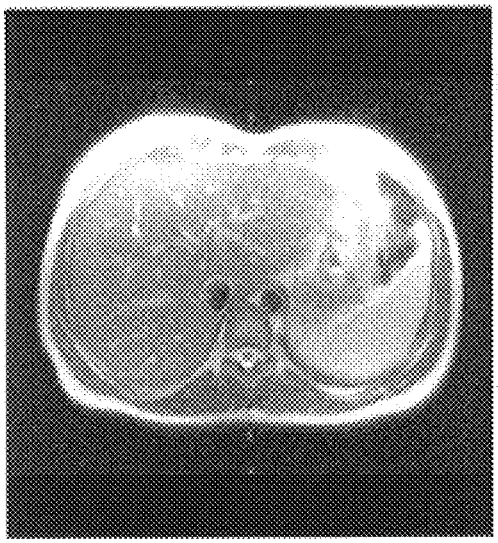
FIG. 6 illustrates a body image example with FIG. 6(a) illustrating the original MR image corrupted with intensity inhomogeneities, FIG. 6(b) illustrating the bias-field corrected image using the present invention and FIG. 6(c) illustrating the recovered bias function in an image.
Figure 6B:
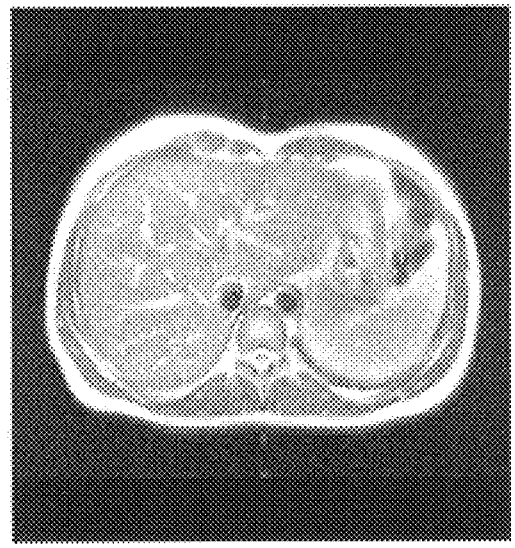
Figure 6C:
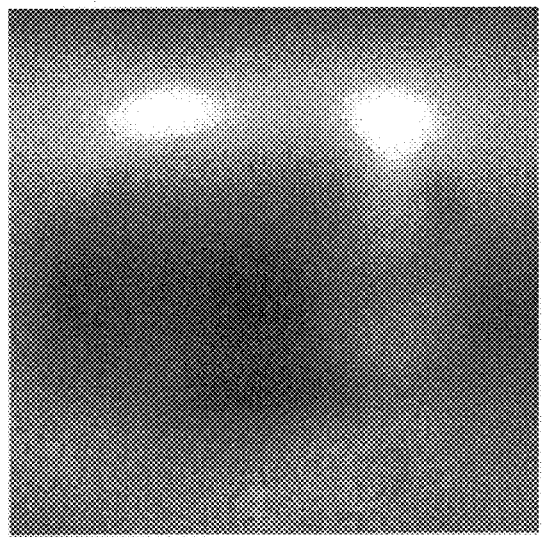
Figure 7A:
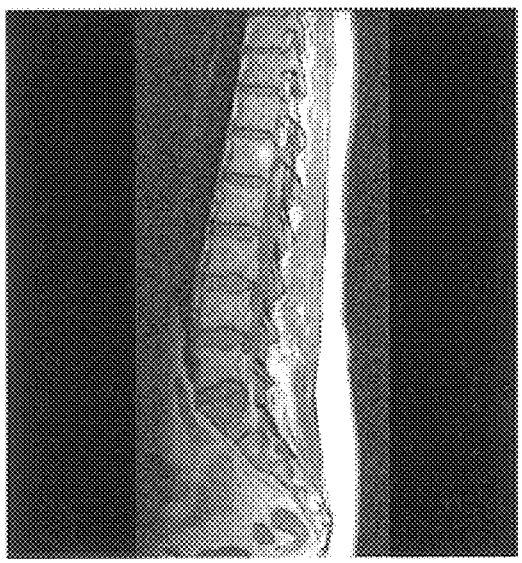
FIG. 7 illustrates a lumbar image example with FIG. 7(a) illustrating the original MR image corrupted with intensity inhomogeneities, FIG. 7(b) illustrating the bias-field corrected image using the present invention and FIG. 7(c) illustrating the recovered bias function in an image.
Figure 7B:
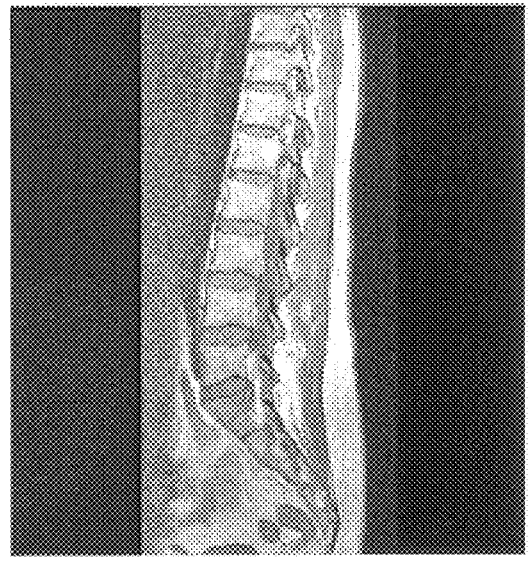
Figure 7C:
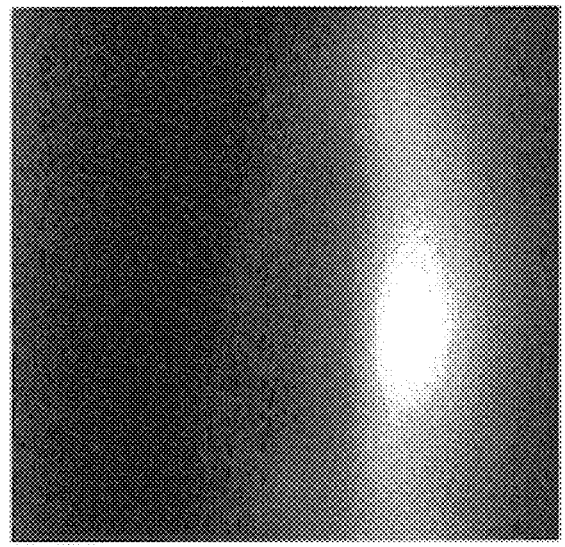

Similarly, FIG. 6 and FIG. 7 depict examples of applying the present invention to a body profile MR image and a lumbar MR image. The bias-field corrected images show great improvement of uniformity in the same tissue classes. This is very helpful for the physician's diagnosis from visual inspection of the image as well as further computer analysis of the image, such as tissue classification.

As discussed in the Description of the Prior Art, most prior art methods usually require either considerable human interactions or intensive computational cost, or assume some prior classification knowledge. The present invention overcomes all of these problems and provides satisfactory correction results. The present invention is fully automatic, applicable to a wide variety of MR images, and very efficient. As an example, the system took less than 0.4 seconds to correct a 256×256 image on a multi-user 185 MHz Sun Ultra-Sparc workstation. For an image of size 512×512, the system took about 0.9 seconds on the same machine.

It is not intended that this invention be limited to the software arrangement or operational procedures shown disclosed. This invention includes all of the alterations and variations thereto as encompassed within the scope of the claims as follows.

We claim:

1. A variational shape-from-orientation apparatus for correcting intensity inhomogeneities in MR images comprising:

a log operator for receiving an original MR image;

a grid operator connected to said log operator;

a compute and select connected to said grid generator;

a bias field surface reconstructor connected to said compute and select and adapt to reconstruct a bias field surface without a prior knowledge of any tissue types depicted in the original MR image and without segmentation of the original MR image with respect to the tissue types;

an intensity inhomogeneities remover connected to said bias field surface reconstructor and said log operator; and an exponential operator connected to said intensity inhomogeneities remover for providing a corrected image.

2. The variational shape-from-orientation apparatus for correcting intensity inhomogeneities in MR images as claimed in claim 1 wherein said log operator comprises:

logarithmic means for performing a logarithmic operation on all intensity values of original bias-field corrupted MR image.

3. The variational shape-from-orientation apparatus for correcting intensity inhomogeneities in MR images as claimed in claim 1 wherein said regular grid generator comprises:

grid generation means for generating a course regular grid on an image domain for finite element discretization of bias field surface function.

4. The variational shape-from-orientation apparatus for correcting intensity inhomogeneities in MR images as claimed in claim 1 wherein said compute and select comprises:

computation means for deriving reliable orientation constraints from original log image at grid locations based on a confidence measure.

5. The variational shape-from-orientation apparatus for correcting intensity inhomogeneities in MR images as claimed in claim 1 wherein said bias field surface reconstructor comprises:

a thin-plate spline surface constructor for estimating a bias field surface function from selected orientation constraints.

6. The variational shape-from-orientation apparatus for correcting intensity inhomogeneities in MR images as claimed in claim 1 wherein said bias field surface reconstructor comprises:

a thin-plate spline surface constructor for providing a solution of a large linear system which is obtained by an efficient preconditioned conjugate gradient algorithm.

7. The variational shape-from-orientation apparatus for correcting intensity inhomogeneities in MR images as claimed in claim 1 wherein said intensity inhomogeneities remover comprises:

subtraction means for subtracting an estimated bias field function from an original log image.

8. The variational shape-from-orientation apparatus for correcting intensity inhomogeneities in MR images as claimed in claim 1 wherein said exponential operator comprises:

operation means for taking an exponential operation of bias-field corrected log image.

9. A variational shape-from-orientation method for correcting intensity inhomogeneities in MR images comprising the steps of:
  taking a log operation on intensity values of an original MR image;
  partitioning an image domain using a grid;
  computing and selecting reliable orientation constraints at grid locations;
  reconstructing a bias field surface from selected orientation constraints with a thin-plate spline by using a preconditioned conjugate gradient;
  removing intensity inhomogeneities by subtracting an estimated bias field function from an original log image; and
  taking an exponential operation on a bias-field corrected log image, wherein said reconstructing step reconstructs the bias field surface without a prior knowledge of any tissue types depicted in the original MR image and without segmentation of the original MR image with respect to the tissue types.

10. The variational shape-from-orientation method for correcting intensity inhomogeneities in MR images as claimed in claim 9 wherein taking a log operation comprises the step of:
  taking the logarithm transformation of I(x,y) where I(x,y) is said original MR image (or a bias field corrupted image).

11. The variational shape-from-orientation method for correcting intensity inhomogeneities in MR images as claimed in claim 9 wherein taking an exponential operation on a bias-field corrected log image comprises the step of:
  calculating I'(x,y)–S'(x,y) where I'(x,y) is a log transformed function of said original MR image and S'(x,y) is a bias-field function.

12. The variational shape-from-orientation method for correcting intensity inhomogeneities in MR images as claimed in claim 9 wherein computing and selecting reliable orientation constraints at grid locations comprises the step of:
  calculating $$\alpha_{i,j} = \frac{c}{c + e_{i,j}}$$

where $\alpha_{i,j}$, a confidence measure, can be assigned for average fitting error $e_{i,j}$ at node (i,j); and where c is a positive constant.

13. The variational shape-from-orientation method for correcting intensity inhomogeneities in MR images as claimed in claim 9 wherein partitioning an image domain using a grid comprises the step of:
  generating a coarse regular grid on an image domain for finite element discretization of bias field surface function.

14. The variational shape-from-orientation method for correcting intensity inhomogeneities in MR images as claimed in claim 9 wherein computing and selecting reliable orientation constraints at grid locations comprises the step of:
  deriving reliable orientation constraints from original log image at grid locations based on a confidence measure.

15. The variational shape-from-orientation method for correcting intensity inhomogeneities in MR images as claimed in claim 9 wherein reconstructing a bias field surface from selected orientation constraints comprises the step of:
  providing a solution of a large linear system which is obtained by an efficient preconditioned conjugate gradient algorithm.

16. A variational shape-from-orientation apparatus for correcting intensity inhomogeneities in MR image comprising:
  a log operator for receiving an original MR image;
  a grid operator connected to said log operator;
  a compute and select connected to said grid generator;
  a bias field surface reconstructor connected to said compute and select and adapted to reconstruct a bias field surface without a prior knowledge of any tissue types depicted in the original MR image and without segmentation of the original MR image with respect to the tissue types;
  an intensity inhomogeneities remover connected to said bias field surface reconstructor and said log operator;
  an exponential operator connected to said intensity inhomogeneities remover for providing a corrected image;
  wherein said bias field surface reconstructor comprises:
  a thin-plate spline surface constructor for providing a solution of a linear system which is obtained by an efficient preconditioned conjugate gradient algorithm.

17. The variational shape-from-orientation apparatus for correcting intensity inhomogeneities in MR images as claimed in claim 16 wherein said log operator comprises:
  logarithmic means for performing a logarithmic operation on all intensity values of original bias-field corrupted MR image.

18. The variational shape-from-orientation apparatus for correcting intensity inhomogeneities in MR images as claimed in claim 16 wherein said regular grid generator comprises:
  grid generation means for generating a coarse regular grid on an image domain for finite element discretization of bias field surface function.

19. The variational shape-from-orientation apparatus for correcting intensity inhomogeneities in MR images as claimed in claim 16 wherein said compute and select comprises:
  computation means for deriving reliable orientation constraints from original log image at grid locations based on a confidence measure.

20. The variational shape-from-orientation apparatus for correcting intensity inhomogeneities in MR images as claimed in claim 16 wherein said intensity inhomogeneities remover comprises:
  subtraction means for subtracting an estimated bias field function from an original log image.

* * * * *